United States Patent
Okuda

(10) Patent No.: US 9,832,896 B2
(45) Date of Patent: Nov. 28, 2017

(54) FLAT CABLE WIRING STRUCTURE

(71) Applicant: KABUSHIKI KAISHA TOKAI RIKA DENKI SEISAKUSHO, Aichi (JP)

(72) Inventor: Ryosuke Okuda, Aichi (JP)

(73) Assignee: KABUSHIKI KAISHA TOKAI RIKA DENKI SEISAKUSHO, Aichi (JP)

( * ) Notice: Subject to any disclaimer, the term of this patent is extended or adjusted under 35 U.S.C. 154(b) by 0 days.

(21) Appl. No.: 15/422,077

(22) Filed: Feb. 1, 2017

(65) Prior Publication Data
US 2017/0223851 A1 Aug. 3, 2017

(30) Foreign Application Priority Data
Feb. 3, 2016 (JP) ................. 2016-019121

(51) Int. Cl.
| | |
|---|---|
| H02G 3/00 | (2006.01) |
| H05K 5/02 | (2006.01) |
| G06F 3/01 | (2006.01) |
| G06F 3/041 | (2006.01) |
| H01B 7/08 | (2006.01) |
| H05K 5/00 | (2006.01) |

(52) U.S. Cl.
CPC ........... *H05K 5/0247* (2013.01); *G06F 3/016* (2013.01); *G06F 3/041* (2013.01); *G06F 3/0416* (2013.01); *H01B 7/08* (2013.01); *H05K 5/0017* (2013.01); *G06F 2203/04103* (2013.01)

(58) Field of Classification Search
CPC .... H05K 5/0247; H05K 5/0017; G06F 3/016; G06F 3/041; G06F 2203/04103; G06F 3/0416; H01B 7/08
USPC ........................................................ 174/70 R
See application file for complete search history.

(56) References Cited

U.S. PATENT DOCUMENTS

| | | | | |
|---|---|---|---|---|
| 2014/0015631 A1* | 1/2014 | Ueda | ........................ | H01F 17/06 336/175 |
| 2014/0104209 A1* | 4/2014 | Ueno | ........................ | H01H 3/12 345/173 |
| 2014/0244041 A1* | 8/2014 | Ishigaki | ................... | G06F 3/016 700/275 |

FOREIGN PATENT DOCUMENTS

| | | |
|---|---|---|
| JP | 2013235441 A | 11/2013 |
| JP | 2014-81809 A | 5/2014 |

OTHER PUBLICATIONS

Office Action issued in a corresponding Japanese Application No. 2016-019121 dated Dec. 20, 2016 (to be provided).

(Continued)

*Primary Examiner* — Sherman Ng
(74) *Attorney, Agent, or Firm* — Roberts Mlotkowski Safran Cole & Calderon P.C.

(57) ABSTRACT

A flat cable wiring structure includes an operation mechanism that detects a physical operation made on an operating surface and outputs a detection signal, a control board, disposed facing the operating surface of the operation mechanism, that outputs a driving signal for imparting vibration to the operation mechanism on the basis of the detection signal, and a flat cable that electrically connects the operation mechanism and the control board. The flat cable includes a routing portion that extends from the operation mechanism to the control board along a movement direction of the operation mechanism. The routing portion includes a bending portion that bends at a bending angle allowing the routing portion to be routed along the control board.

6 Claims, 2 Drawing Sheets

(56) References Cited

OTHER PUBLICATIONS

European Search Report from European Application No. 17154519.7 dated Jun. 19, 2017.
JP Application No. 2016-019121 Office Action dated Dec. 20, 2016.

* cited by examiner

20 TOUCH PANEL MECHANISM
23 TOUCH SENSOR BOARD
23a CONNECTOR
40 TACTILE SENSATION PRESENTATION MECHANISM

FLAT CABLE WIRING STRUCTURE

The present application is based on Japanese patent application No. 2016-019121 filed on Feb. 3, 2016, the entire contents of which are incorporated herein by reference.

BACKGROUND OF THE INVENTION

Technical Field

The present invention relates to a flat cable wiring structure, and particularly relates to a flat cable wiring structure applied in an operation device including a vibration imparting mechanism that imparts vibrations on an operating surface.

Background Art

An operation device including a touch panel device capable of push operations and a tactile sensation presentation device that presents a vibratory stimulation operation sensation to an operator's fingers when an operation input is made on the touch panel device is known as an example of an operation device including a vibration imparting mechanism that imparts vibrations on an operating surface (see Patent Document 1, for example).

In the operation device disclosed in the above-described Patent Document 1, the touch panel device and the tactile sensation presentation device are incorporated into a body, made from resin, that has a downward-facing opening. By fastening a cover member, made from resin, to the downward-facing opening of the body, a required space is secured between the cover member and the body.

A control board on which a connector is mounted is installed on an upper surface of the cover member, and a flexible flat cable is extended and arranged in an S-shape within the space between the cover member and the body. The control board and a touch sensor board of the touch panel device are electrically connected by the flat cable.

CITATION LIST

Patent Literature

Patent Document 1: Japanese Unexamined Patent Application Publication. No. 2014-81809A

SUMMARY OF INVENTION

Technical Problem

In this type of operation device, the flat cable is extended from the touch sensor board to the control board and arranged in an S-shape within the body, and tension is applied in the vertical direction of the flat cable.

With such a structure, when the tactile sensation presentation device is operated so as to cause the touch panel device to produce vibratory feedback in the vertical direction, the touch panel device vibrates in the vertical direction while being affected by the tension of the flat cable. As such, there are cases where the tension of the flat cable causes the vibrating height of the touch panel device to become unstable. What is needed, therefore, is a way to prevent control of the vibrating height of the touch panel device from being inhibited.

Accordingly, an object of the present invention is to provide a flat cable wiring structure that enables stable vibratory feedback control to be carried out without being affected by tension.

Solution to Problem

To achieve the above-described object, the present invention provides a flat cable wiring structure including: an operation mechanism that detects a physical operation made on an operating surface and outputs a detection signal; a control board, disposed facing the operation mechanism, that outputs a driving signal for imparting vibration on the operation mechanism on the basis of the detection signal; and a flat cable that electrically connects the operation mechanism and the control board. The flat cable includes a routing portion extending from the operation mechanism to the control board along a movement direction of the operation mechanism. The routing portion includes a bending portion that bends at a bending angle allowing the routing portion to be routed along the control board.

Preferably, in the flat cable wiring structure according to the present invention, the routing portion includes a first routing portion hanging down from a back surface of the operation mechanism toward the control board, and a second routing portion extending along a back surface of the control board; and the bending portion is formed by bending a portion where the first routing portion and the second routing portion intersect.

Furthermore, preferably, in the flat cable wiring structure according to the present invention, the bending portion is arranged movable along a movement trajectory of the routing portion extending along the control board when vibration is imparted on the operation mechanism.

Furthermore, preferably, in the flat cable wiring structure according to the present invention, the second bending portion is configured to undergo a flexing deformation so as to absorb a counter force to a stress transmitted from the operation mechanism to the second routing portion when vibration is imparted to the operation mechanism. Furthermore, preferably, in the flat cable wiring structure according to the present invention, the second bending portion is configured such that the bending portion serves as a starting point of the flexing deformation.

Furthermore, preferably, in the flat cable wiring structure according to the present invention, one end of the first bending portion is connected to a first connector on the back surface of the operation mechanism, the first connector being formed in a direction vertical to the back surface of the operation mechanism, and one end of the second bending portion is connected to a second connector on the back surface of the control board, the second connector being formed in a direction parallel to the back surface of the control board.

Advantageous Effects of Invention

According to the present invention, stable vibratory feedback control can be carried out without being affected by tension of a flat cable.

DESCRIPTION OF EMBODIMENTS

Preferred embodiments of the present invention will be described in detail hereinafter with reference to the appended drawings.

Overall Configuration of Operation Device

Figure 1:
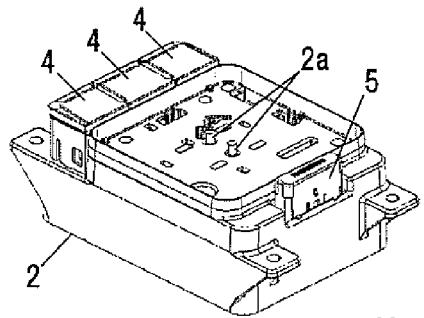
FIG. 1 is an exploded perspective view schematically illustrating an operation device including a typical tactile sensation presentation mechanism according to an embodiment of the present invention.
Figure 1:
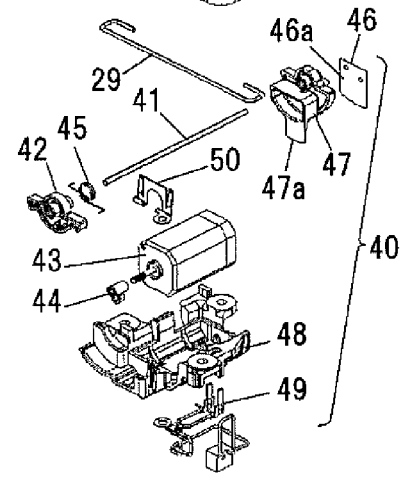
Figure 1:
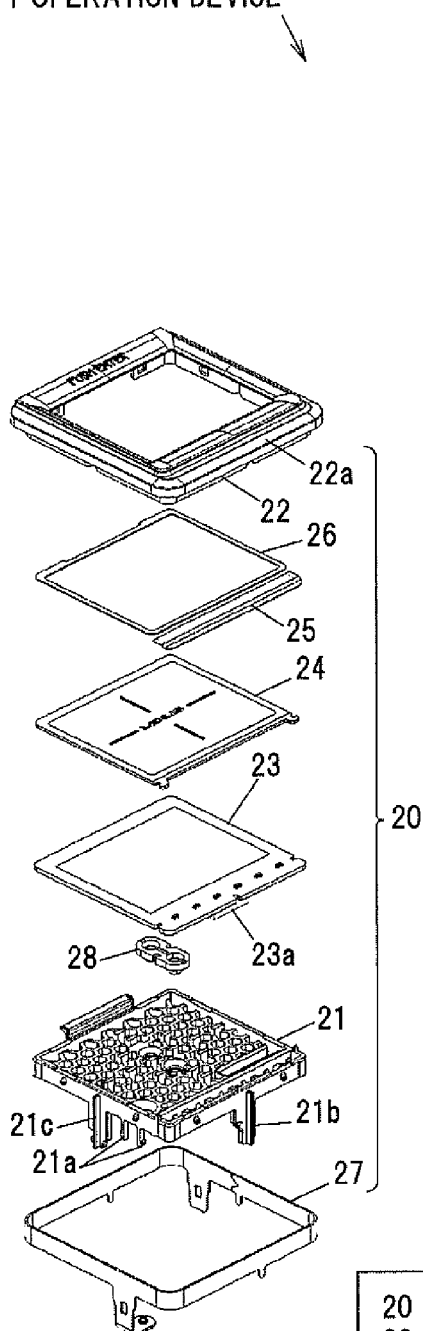
Figure 1:
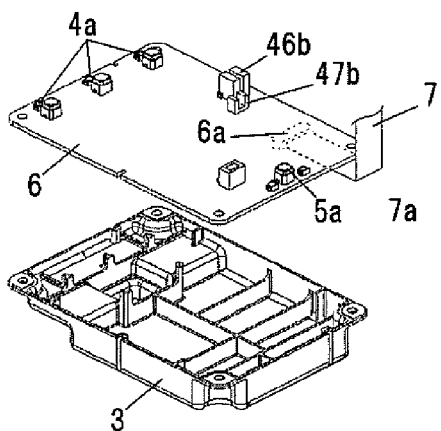

FIG. 1 schematically illustrates an example of constituent elements of a representative operation device according to the present embodiment, which is indicated as a whole by reference numeral 1.

The operation device 1 illustrated as an example in FIG. 1 is not particularly limited, but can be employed preferably in, for example, a vehicle-based touch panel that outputs operation signals for controlling the operations of vehicle-mounted devices such as air conditioning devices, audio devices, and navigation devices. The operation device 1 is disposed in the vicinity of a driver's seat within the vehicle cabin, such as in a center console (not illustrated), and is connected to a display (also not illustrated) via a wire.

The operation device 1 includes a touch panel mechanism 20 capable of push operations and a tactile sensation presentation mechanism 40 that presents a vibratory stimulation operation sensation to an operator's fingers when the touch panel mechanism 20 is subjected to an operation input. The operation device 1 is configured as a remote operation input device in which, when a touch operation is made on the touch panel using the operator's fingers, a location on the surface of the touch panel, for example, is detected by a touch sensor. An item button in a display is selected and determined by a location detection signal corresponding to that location.

The constituent elements of the touch panel mechanism 20 and the tactile sensation presentation mechanism 40 are incorporated into a body 2. The body 2 is made from resin and formed in the shape of a case having a downward-facing opening. The operation device 1 is configured with the touch panel mechanism 20 and the tactile sensation presentation mechanism 40 integrated by fastening a cover member 3 by screws (not illustrated). The cover member 3 is made from resin and covers the downward-facing opening in the body 2.

First to third operation knobs 4, 4, and 4 are provided in a single rode on one side portion of the body 2.

A fourth operation knob 5 is provided on another side portion of the body 2. The first to fourth operation knobs 4 and 5 are disposed capable of turning corresponding push switches 4a and 5a on and off, respectively. The push switches 4a or 5a are mounted on a control board 6 via pushers (not illustrated).

Configuration of Touch Panel Mechanism

The touch panel mechanism 20 is configured as an operation mechanism having a function of detecting a physical operation made on an operating surface and outputting a detection signal, and is assembled as a touch sensor board 23 and a sheet-shaped touch panel 24 affixed to each other with electrically conductive tape 25 between a planar quadrangular base 21 made from resin and a quadrangular frame 22 made from resin. Note that a push operation made on the operating surface can be given as an example of the physical operation.

The touch sensor board 23 is, for example, an electrostatic capacitance-type touch sensor that detects electrostatic capacitance. A connector 23a mounted on the touch sensor board 23 is electrically connected to a connector 6a mounted on the control board 6 by a flexible flat cable 7. The control board 6 constitutes a control circuit and the like that controls the touch panel mechanism 20 and the tactile sensation presentation mechanism 40, and has a driving circuit that outputs a driving signal for imparting vibrations on the touch panel 24 on the basis of the detection signal from the touch sensor board 23.

Meanwhile, the touch panel 24 is affixed to a back surface of a frame portion 22a of the frame 22 by double-sided tape 26 having sealing properties, and is disposed with the operating surface exposed in an opening of the frame portion 22a such that push operations are possible.

A quadrangular frame-shaped shielding member 27 is disposed covering an outer peripheral portion of the touch panel mechanism 20. The shielding member 27 is electrically connected to a ground circuit of the control board 6.

The touch sensor board 23 is elastically supported on an upper surface of the base 21 by a click member 28. The click member 28 passes through an opening defined penetrating through the base 21, and makes contact with and is supported by columnar parts 2a formed protruding toward the surface of the base that faces the body 2. The position where the click member 28 is disposed is a position that takes the position where the touch panel mechanism 20 first stops as a reference. The position is set as a reference position $Z_0$ of the touch panel 24.

A plurality of elastic engagement tabs 21a that engage with through-holes defined in the body 2, a pair of guide tabs 21b and 21b that are guided along guide holes defined in the body 2, and a linking tab 21c that moves in tandem with the tactile sensation presentation mechanism 40 that presents an operation sensation of a tactile sensation stimulation to the operator's fingers extend from a lower surface of the base 21.

Respective ends of a stabilizer 29 that suppresses tilted movement of the touch panel mechanism 20 during push operations are attached to the pair of guide tabs 21b. The linking tab 21c is disposed corresponding to a positional sensor (not illustrated) that detects a position of the touch panel mechanism 20.

Configuration of Tactile Sensation Presentation Mechanism

The tactile sensation presentation mechanism 40 includes a linking member 42 fixed to one end of a support shaft 41 that is in turn fixed rotatably to the body 2 and intersects with the stabilizer 29, and a rotating cam member 44 fixed to an output shaft of a motor 43 capable of forward and reverse rotation.

A torsion spring 45 is attached to the linking member 42. The torsion spring 45 is configured to continually bias the linking member 42 in one direction. An encoder 46 that detects a position of the linking member 42 and an enter switch 47 that detects whether the push operation of the touch panel 24 is on or off are attached to another end of the support shaft 41, which rotates integrally with the linking member 42.

The encoder 46 is a rotary encoder constituted of an encoder slit plate 46a and a photointerrupter 46b. The encoder slit plate 46a rotates as the base 21 moves up and down, and can thus detect movement of the touch panel 24, which is fixed to the base 21, at a high resolution.

Meanwhile, the enter switch 47 is constituted of an enter switch plate 47a and a photointerrupter 47b. The enter switch plate 47a is attached to the support shaft 41 and thus detects enter operations of the touch panel 24 fixed to the base 21.

The motor 43 capable of forward and reverse rotation is held by a housing 48, and the housing 48 is fastened to the body 2 by screws illustrated). The motor 43 is electrically connected to the control board 6 by a terminal 49 having a cord electrically connected to the control board 6 and a ground clip 50 enabling static electricity that has built up in the motor 43 to escape to the ground circuit of the control board 6.

The rotating cam member 44 is a motion converting member that converts reciprocating rotational motion of the motor 43 into reciprocating linear motion of the touch panel mechanism 20, and is configured to rotate at a predetermined angle while making contact with a cam follower surface of the linking member 42. With a cam surface of the rotating cam member 44 in contact with the cam follower surface of the linking member 42, the rotating cam member 44 imparts, by moving a predetermined amount, a vibratory feedback force that pushes the touch panel 24 upward.

Flat Cable Wiring Structure

When the vibratory feedback force is imparted on the touch panel 24 by the operation of the tactile sensation presentation mechanism 40, it is crucial to control the vibrating height of the touch panel 24 without that height being affected by the tension of the flat cable 7.

Accordingly, the primary basic configuration of the operation device 1 according to the present embodiment is a wiring structure for the flat cable 7 that reduces counterforce (resistance) from tension acting on the touch panel 24 when the vibratory feedback force is imparted on the touch panel 24 as a result of the operation of the tactile sensation presentation mechanism 40. As such, the operation device 1 configured as described above is one example of a configuration according to the present embodiment, and shapes, structures, and the like of the constituent elements thereof are not intended to be limited to this example.

For example, a flexible flat cable (FTC), which is a wiring member in which electrical conductors are arranged parallel to each other, a flexible printed circuit board (FPC), in which wiring patterns constituted of copper foil are formed, or the like can be used as the flat cable 7. A fixed contact part that is electrically connected to the connector 23a of the touch sensor board 23 is formed on one end part of the flat cable 7, and a fixed contact part that is electrically connected to the connector 6a of the control board 6 is formed on another end part of the flat cable 7.

Figure 2:
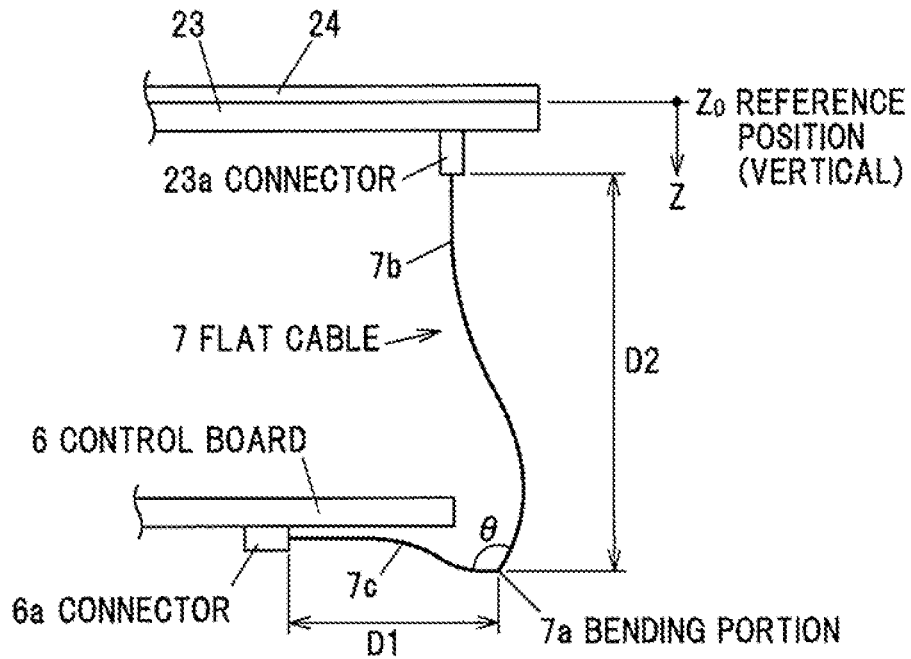
FIG. 2 is a schematic diagram illustrating a state in which a flat cable applied in an operation device according to an embodiment is incorporated into the interior of the device.

As illustrated in FIG. 2, the flat cable 7 has an L-shaped bending portion 7a at which a first routing portion 7b and a second routing portion 7c bend at a prescribed bending angle θ. The bending portion 7a is arranged on an intersecting line at which the first routing portion 7b and the second routing portion 7c intersect. The first routing portion 7b hangs downward from a back surface of the touch sensor board 23 toward a back surface side of the control board 6 while bending slightly in opposite directions. Meanwhile, the second routing portion 7c extends along the back surface of the control board 6 while bending slightly, such that the bending portion 7a is arranged in a convex shape on the back surface of the control board 6.

Although not limited to the example illustrated in the drawings, the bending portion 7a is shaped while bending to a bending angle θ of approximately 90°. A routing distance D1 from the fixed contact part on the control board 6 side of the flat cable 7 to the bending portion 7a is set to be shorter than a routing distance D2 from bending portion 7a to the fixed contact part on the touch sensor board 23 side. The bending angle θ and routing distances D1 and D2 of the flat cable 7 are uniquely determined by positioning the touch panel 24 at the reference position $Z_0$.

Figure 3:
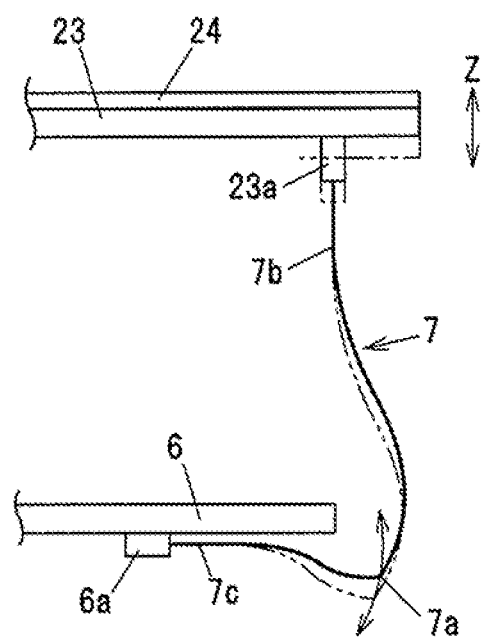
FIG. 3 is a schematic diagram illustrating movement of a flat cable when a tactile sensation presentation mechanism operates.

As illustrated in FIGS. 2 and 3, when the touch panel 24 is caused to vibrate by the operation of the tactile sensation presentation mechanism 40, the first routing portion 7b of the flat cable 7 moves in tandem with the up-and-down vibration of the touch panel 24.

As a result of the movement of the first routing portion 7b, the bending portion 7a of the flat cable 7 is subjected to stress in a movement direction that takes the control board 6-side fixed contact part as a point of support, and moves along a movement trajectory of the second routing portion 7c extending along the back surface of the control board 6. The second routing portion 7c undergoes flexing deformation as a result. The counterforce acting on the touch panel 24 is absorbed by this flexing deformation.

With this wiring structure for the flat cable 7, a counterforce receiving portion is constituted by the second routing portion 7c and the bending portion 7a that serves as a starting point of the flexing deformation of the second routing portion 7c. This counterforce receiving portion moves in response to the up-and-down vibration of the touch panel 24, with the control board 6-side fixed contact part serving as a point of support.

Reducing the counterforce (resistance) to the stress transmitted from the touch panel 24 to the second routing portion 7c through the first routing portion 7b stabilizes the positional displacement of the bending portion 7a of the flat cable 7. Alleviating the counterforce of the tension of the flat cable 7 acting on the touch panel 24 ensures that the vibrating touch panel 24 is not affected by the counterforce of the flat cable 7.

In the example illustrated in the drawings, the second routing portion 7c is routed along the back surface of the control board 6, which prevents interference with the control board 6 caused by the first routing portion 7b hanging down, prevents interference with the control board 6 when the touch panel 24 vibrates, and the like. However, the configuration is not limited thereto. The second routing portion 7c may be routed along a front surface of the control board 6 as long as there is no interference between the control board 6 and the second routing portion 7c.

Furthermore, although a usage example in which the flat cable 7 is routed with some slack so as to bend slightly is described, the configuration is not limited to a case where the flat cable 7 is routed with slack.

The effects of counterforce from the flat cable 7 when the touch panel 24 vibrates can be suppressed even in a case where the flat cable 7 is routed without any slack, with the flat cable 7 being routed linearly from the control board 6-side fixed contact part to the bending portion 7a and routed linearly from the bending portion 7a to the touch sensor board 23-side fixed contact part.

Effect of Embodiment

The wiring structure for the flat cable 7 configured as described above provides the following effects in addition to those described above.

The counterforce can be received by the second routing portion 7c, rather than the counterforce being received solely by the bending portion 7a of the flat cable 7. As a result, when the touch panel mechanism 20 vibrates, the counterforce (resistance) that the touch panel 24 receives from the flat cable 7 can be reduced, and a stable vibrating height can be ensured for the touch panel 24 without being affected by the counterforce (resistance) of the flat cable 7.

It is less likely that the counterforce (resistance) of the flat cable 7 acting on the touch panel 24 will change over time, which makes it possible to ensure that the shape of the flat cable 7 remains stable over a long period of time.

The bending angle θ and routing distances D1 and D2 of the flat cable 7 can be uniquely determined by positioning the touch panel 24 at the reference position $Z_0$, and thus the counterforce (resistance) of the flat cable 7 acting on the touch panel 24 is stabilized. Accordingly, the vibrating height of the touch panel 24 can be stabilized.

Application Examples

A representative example of the configuration of the operation device 1 according to the present invention has been described according to an embodiment and the drawings. However, application examples such as those described hereinafter are also possible.

Although the example described in the embodiment and illustrated in the drawings refers to a case where the device is applied in an automobile, the present invention is not limited thereto. The device can of course be effectively applied in various types of vehicles such as construction machinery and agricultural machinery.

The device is not limited to a vehicle-mounted device, and can of course be applied in various types of terminal devices such as game devices, personal computers, and mobile telephones.

An operation sensation can be imparted by the above-described tactile sensation presentation mechanism 40 even in various types of operation input devices including operation mechanisms aside from the touch panel mechanism 20, and thus the device can also be applied in a mouse, a keyboard, or a push-button switch, for example.

As is clear from the above description, although a representative embodiment and drawings according to the present invention are exemplified, the above-described embodiment and drawings are not intended to limit the scope of the invention defined in the patent claims. Accordingly, it should be noted that all combinations of the features described in the embodiment and illustrated in the drawings are not necessary to solve the problem of the present invention.

What is claimed is:

1. A flat cable wiring structure, comprising:
   an operation mechanism that detects a physical operation made on an operating surface and outputs a detection signal;
   a control board, disposed facing the operating surface of the operation mechanism, that outputs a driving signal for imparting vibration to the operation mechanism on the basis of the detection signal; and
   a flat cable that electrically connects the operation mechanism and the control board,
   wherein the flat cable comprises a routing portion that extends from the operation mechanism to the control board along a movement direction of the operation mechanism, and
   wherein the routing portion comprises a bending portion that bends at a bending angle allowing the routing portion to be routed along the control board.

2. The flat cable wiring structure according to claim 1, wherein the routing portion comprises a first routing portion hanging down from a back surface of the operation mechanism toward the control board, and a second routing portion extending along a back surface of the control board, and
   wherein the bending portion is formed by bending a portion where the first routing portion and the second routing portion intersect with each other.

3. The flat cable wiring structure according to claim 2, wherein the bending portion is arranged movable along a movement trajectory of the second routing portion extending along the control board when vibration is imparted to the operation mechanism.

4. The flat cable wiring structure according to claim 2, wherein the second bending portion is configured to undergo a flexing deformation so as to absorb a counter force to a stress transmitted from the operation mechanism to the second routing portion when vibration is imparted to the operation mechanism.

5. The flat cable wiring structure according to claim 4, wherein the second bending portion is configured such that the bending portion serves as a starting point of the flexing deformation.

6. The flat cable wiring structure according to claim 1, wherein one end of the first bending portion is connected to a first connector on the back surface of the operation mechanism, the first connector being formed in a direction vertical to the back surface of the operation mechanism, and
   wherein one end of the second bending portion is connected to a second connector on the back surface of the control board, the second connector being formed in a direction parallel to the back surface of the control board.

* * * * *